US008146030B2

(12) United States Patent
Burnette et al.

(10) Patent No.: US 8,146,030 B2
(45) Date of Patent: Mar. 27, 2012

(54) INTERACTIVE LOOP CONFIGURATION IN A BEHAVIORAL SYNTHESIS TOOL

(75) Inventors: David Gaines Burnette, Tigard, OR (US); Peter Pius Gutberlet, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 473 days.

(21) Appl. No.: 12/353,210

(22) Filed: Jan. 13, 2009

(65) Prior Publication Data

US 2009/0172634 A1    Jul. 2, 2009

Related U.S. Application Data

(60) Division of application No. 10/930,235, filed on Aug. 30, 2004, now Pat. No. 7,496,864, which is a continuation of application No. 10/126,911, filed on Apr. 19, 2002, now Pat. No. 6,817,007.

(60) Provisional application No. 60/285,656, filed on Apr. 20, 2001.

(51) Int. Cl.
    *G06F 17/50*    (2006.01)
(52) U.S. Cl. .................. 716/104; 716/113; 716/132
(58) Field of Classification Search .................. 716/104, 716/113, 132
    See application file for complete search history.

(56) References Cited

U.S. PATENT DOCUMENTS

| | | | |
|---|---|---|---|
| 6,611,952 B1 | 8/2003 | Prakash et al. | |
| 6,691,301 B2 | 2/2004 | Bowen | |
| 6,701,501 B2 | 3/2004 | Waters et al. | |
| 6,704,908 B1 | 3/2004 | Horan et al. | |
| 6,754,885 B1 * | 6/2004 | Dardinski et al. | 717/113 |
| 2002/0186246 A1 | 12/2002 | Burnette et al. | |
| 2003/0005404 A1 | 1/2003 | Bowyer et al. | |
| 2003/0033039 A1 | 2/2003 | Gutberlet et al. | |
| 2003/0105620 A1 | 6/2003 | Bowen | |

OTHER PUBLICATIONS

U.S. Appl. No. 60/362,679, filed Mar. 8, 2002, Prakash et al.
"Loops", *Understanding Behavioral Synthesis (A Practical Guide to High-Level Design)*, by John P. Elliott, Chapter 6, pp. 77-103 (1999).
"Pipelining", *Understanding Behavioral Synthesis (A Practical Guide to High-Level Design)*, by John P. Elliott, Chapter 8, pp. 137-154 (1999).
"Handel-C: Software Compiled System Design," http://www.celoxica.com/methodology/handelc.asp; 2 pages; website visited on Dec. 10, 2003.

* cited by examiner

*Primary Examiner* — Thuan Do
(74) *Attorney, Agent, or Firm* — Klarquist Sparkman, LLP

(57) ABSTRACT

A behavioral synthesis tool for generating an integrated circuit design is described. The behavioral synthesis tool allows a designer to interactively allocate loop configuration information without having to modify a source code description of the integrated circuit. The behavioral synthesis tool reads the source code description and generates a synthesis intermediate format stored in memory. The synthesis tool searches the in-memory synthesis intermediate format to find loops. The loops are then listed in a graphical user interface (GUI) in hierarchical fashion. The GUI also lists loop configuration information associated with the loops, such as loop frequency, loop unrolling and loop pipelining. The GUI allows the designer to modify the loop configuration information without having to update the source code description. Upon completion of modifying the loop configuration information, the designer saves the changes illustrated in the GUI and such changes are effectuated by automatically updating the synthesis intermediate format.

20 Claims, 12 Drawing Sheets

INTERACTIVE LOOP CONFIGURATION IN A BEHAVIORAL SYNTHESIS TOOL

CROSS-REFERENCE TO RELATED APPLICATIONS

This application is a divisional of U.S. patent application Ser. No. 10/930,235, filed Aug. 30, 2004 now U.S. Pat. No. 7,496,864 which is a continuation of U.S. patent application Ser. No. 10/126,911, filed Apr. 19, 2002 now U.S. Pat. No. 6,817,007 which in turn claims the benefit of U.S. provisional application No. 60/285,656, filed Apr. 20, 2001. The entire contents of these applications are incorporated herein by reference.

FIELD

The present invention relates generally to behavioral synthesis tools for creating integrated circuits, and more particularly relates to behavioral synthesis tools that allow for interactive loop manipulation during the design of integrated circuits.

BACKGROUND

The design of complex computer hardware no longer begins with a circuit diagram. Instead, it begins with a software program that describes the behavior or functionality of a circuit. This software program is written in a hardware description language (HDL) that defines an algorithm to be performed with limited implementation details. Designers direct behavioral synthesis tools to generate alternate architectures by modifying constraints (such as clock period, number and type of data path elements, and desired number of clock cycles). Behavioral synthesis tools convert the HDL program into a register transfer level (RTL) description. The RTL description is used to ultimately generate a netlist that includes a list of components in the circuit and the interconnections between the components. This netlist is used to create the physical integrated circuit.

In HDL source code, loops may be used to conveniently describe the behavior of a hardware circuit. For example, "WHILE" loops, "FOR" loops, and "INFINITE" loops may be used in HDL code that are similar to loop declarations used in other programming languages. An INFINITE loop is a loop that does not describe any conditions for exiting the loop in its declaration. By contrast, FOR and WHILE loops describe in their declaration the conditions under which the loop is terminated.

Loop unrolling is a transformation that may be applied to the loop construct. When a loop is unrolled, the statements inside the loop are copied as many times as the loop is unrolled. When the loop is unrolled, the control structure of the loop is modified to maintain the same functionality. Loops may be either completely unrolled or partially unrolled. For each copy of the loop statements, the iteration variable is replaced with the appropriate constant for that iteration of the loop. For example, the FOR loop in table 1 can be unrolled to the format of table 2

TABLE 1

FOR I IN 0 to 7 LOOP
   tmp := tmp + s(I);
End LOOP;

TABLE 2 tmp := tmp + s(0);
tmp := tmp + s(1);
tmp := tmp + s(2);
tmp := tmp + s(3);
tmp := tmp + s(4);
tmp := tmp + s(5);
tmp := tmp + s(6);
tmp := tmp + s(7);

Behavioral synthesis tools also support pipelining techniques to improve the throughput of synthesized designs. Pipelining can be used in designs to reduce the latency of a design or to reduce the total area of the components used in the design. Loop pipelining is a feature of behavioral synthesis tools that allows one iteration of a loop to begin before the previous iteration is completed. Loop pipelining can be used to increase the throughput of a loop, but often at the expense of additional component area. A pipelined component is usually created from a combinational component with similar functionality by dividing the logic of the combinational component into multiple stages and placing registers between the stages to hold intermediate results. Pipelined components are characterized by their initialization interval, latency, output delay, and minimum clock period. The initialization interval of a pipelined component specifies the rate at which the component can begin processing new input data. Most pipelined components have an initialization interval of 1, which means that the component can begin processing new input data every clock cycle. The latency of a pipelined component specifies the number of clock cycles it takes to compute output values. This value is one less than the number of stages in the pipelined component. The output delay of the pipelined component is the combinational delay through the last stage of the pipe. If the pipelined component registers its outputs, the value of the output delay is just the clock-to-output delay of the register. The minimum clock period is determined by the longest path between registers within the component. If the clock period were shorter than this value, the component would be unable to correctly capture intermediate values.

Some behavioral synthesis tools unroll loops by default and set default values for loop pipelining. However, the designer also can manipulate loop unrolling and pipelining through the use of HDL attributes or directives. For example, Synopsis® tools use a "pragma" statement in the source code to allow the designer to manipulate loops. Those skilled in the art recognize that loop unrolling and loop pipelining are mutually exclusive.

After the designer designates the loop unrolling and loop pipelining in the HDL source code (using pragma statements or other directives), the designer runs the source code through the synthesis tool. The synthesis tool generates a report that the designer can use to analyze the performance of the circuit. For example, the user can examine the speed and area of the circuit to determine whether the loop unrolling and pipelining is acceptable. If the loop configuration is unacceptable, the designer must return to an editor, re-edit the source code to change the loop configurations, and run the source code through the synthesis tool again. Such a technique for modifying the loops is time consuming and inefficient. Moreover, the designer cannot easily visualize the effects of the loop configuration the while modifying the source code.

It is desirable, therefore, to provide a synthesis tool that allows a designer to manipulate loops more quickly and simply. It is further desirable to allow a designer to readily visualize the effects of the loop configuration.

SUMMARY

The present invention allows a designer to interactively configure loops (via unrolling or pipelining) in an integrated circuit design without having to modify the source code description of the circuit. Using a graphical user interface (GUI), the designer can modify the loop configurations easily and see the results of the modification without having to generate the RTL code, perform RTL synthesis, etc. For example, the designer can readily view an area-versus-speed chart of the circuit to better determine whether the loop configurations are acceptable.

In one aspect, a source code file having a description of the hardware is read into a database within the synthesis tool. The synthesis tool analyzes the source code file and generates a data structure associated with the source code file. The designer can then invoke a GUI that lists the loops from the source code in a hierarchical fashion, together with the default values of the loop frequency, loop unrolling, and pipelining. The designer can then interactively modify the loops by changing the loop unrolling, and/or pipelining without having to change the source code file.

Further features and advantages of the invention will become apparent with reference to the following detailed description and accompanying drawings.

BRIEF DESCRIPTION OF THE DRAWINGS

FIG. 8 is an illustration of a graphical user interface showing the modified loop configurations have been changed dynamically.

FIG. 12 is an illustration of a graphical user interface showing an unrolled loop with subloops individually manipulatable.

DETAILED DESCRIPTION

Figure 1:
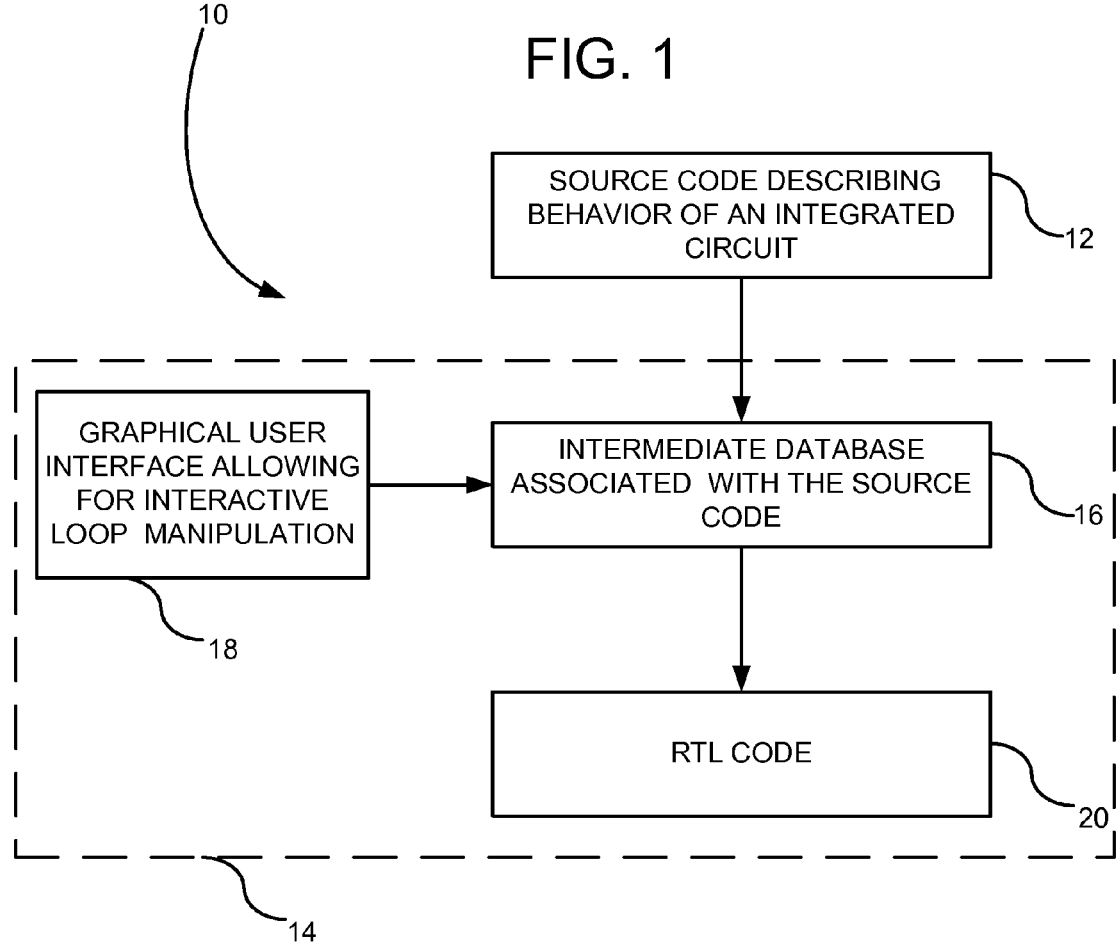
FIG. 1 is a block diagram of a system for allowing interactive manipulation of loop configurations.

FIG. 1 shows a system 10 for generating an integrated circuit. A designer typically creates a behavioral description of an integrated circuit by generating source code file 12 using a separate editor (not shown). The source code is described generically as HDL and may be written in C, C++, VHDL, Verilog, etc. Once the source code 12 is complete, a behavioral synthesis tool 14 reads in the source code file 12 and allows a designer to evaluate and modify the circuit architecture early in the design process. In particular, the source code 12 is read into an intermediate database 16 that holds the behavioral description as a data structure. This data structure, called a synthesis intermediate format (SIF), is modifiable by the user through a graphical user interface (GUI) 18. The GUI 18 allows the designer to interactively and dynamically modify the loop configurations in the data structure. Additionally, the designer may also quickly evaluate the area and latency associated with different loop configurations. Once the designer is satisfied with the architecture, the RTL code is generated as shown at 20. Further processing is then performed on the RTL code to ultimately generate the integrated circuit. The behavioral synthesis tool 14 may be executed on any desired general purpose computer having a monitor for displaying the GUI and having any desired user input, such as a mouse, keyboard, etc.

In previous systems, in order to change the loop configuration, the designer was required to reload an editor and modify the source code 12 directly. The designer would then have to reload the source code into the behavioral synthesis tool and generate the RTL code in order to evaluate the resulting architecture. The system 10, on the other hand, allows the designer to modify the intermediate database 16 using the graphical user interface 18. Thus, the designer does not have to edit the source code to modify the loop configuration.

Figure 2:
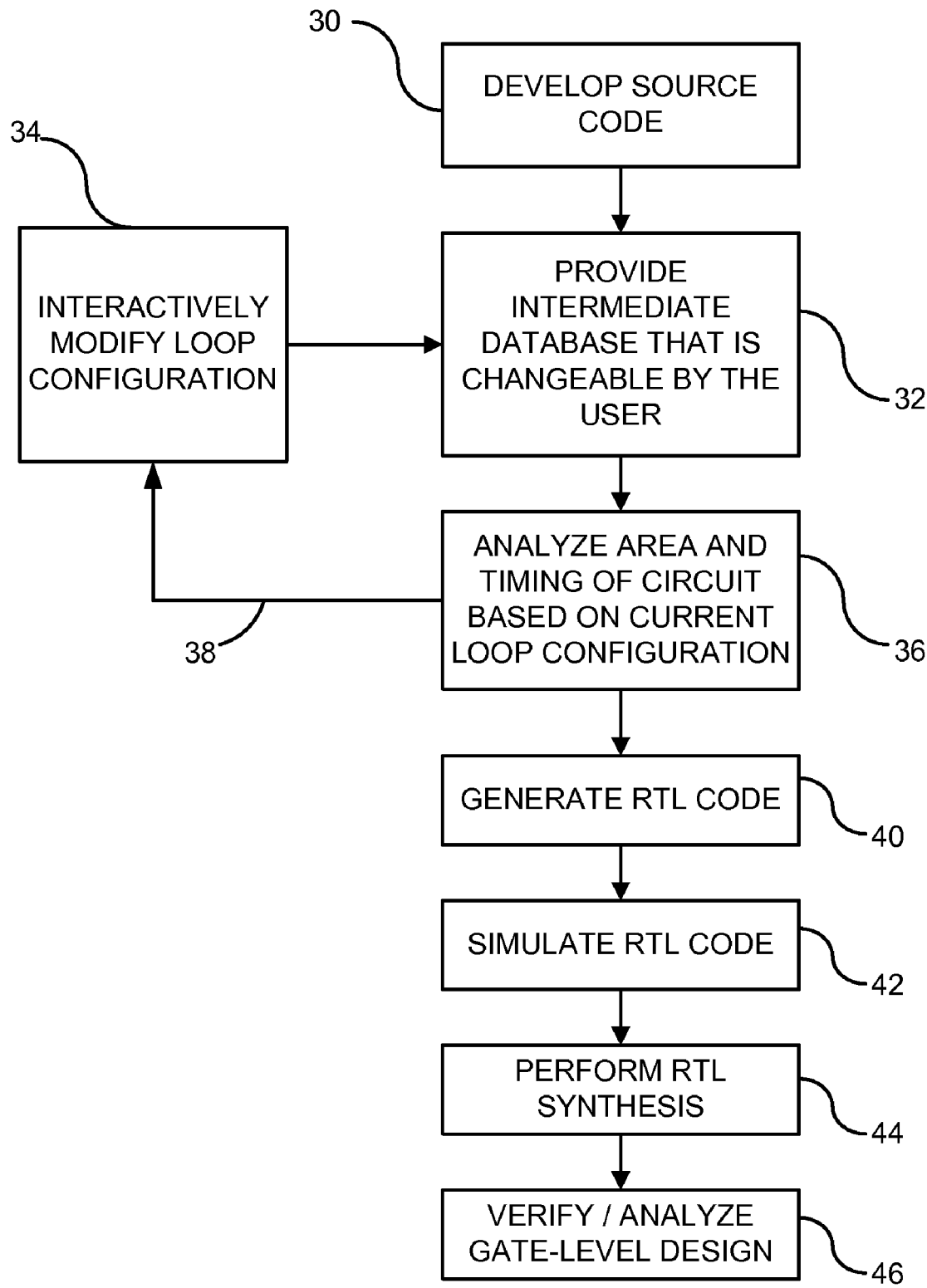
FIG. 2 is a detailed diagram illustrating a design flow for creating an integrated circuit using the system of FIG. 1.

FIG. 2 shows a more detailed flow chart for generating an integrated circuit according to the invention. In process block 30, the designer develops the source code as already described. In process block 32, the behavioral synthesis tool 14 (see FIG. 1) reads the source code into the intermediate database 16 and generates a data structure that is changeable by the designer. When generating the data structure, the synthesis tool performs an analysis of the source code. For example, the synthesis tool searches for loop structures in the source code and generates the data structure based on these loop structures. Additionally, the synthesis tool searches for directives and uses the directives as defaults for the loop configurations.

At this point in the flow, the loop configuration information is stored in the intermediate database independently, without performing the transformations. This allows the designer to interactively change the loop configuration and control when such changes are applied to the SIF. The loop configuration information is stored as a hierarchical arrangement of loops with the default settings of child loops taking on the values of parent loops in the hierarchy. The data structure may be organized in many different ways. One possible organization is to have the following fields:

Parent/Child relationship of loop.
Frequency
Loop unrolling
Loop pipelining

In process block 34, the designer can interactively modify the loop configuration for loops in the source code. That is, the source code includes loops that have configuration information associated with them, such as loop unrolling and pipelining. Thus, in process block 34, the designer can choose to modify the loop configuration information to change the unrolling and pipelining configuration, etc. Other features of the GUI are described further below.

After the loops are properly configured, the designer can perform an initial check to analyze the area and timing of the circuit (process block 36). This may be done, for example, by displaying an area versus latency graph that gives the designer some immediate feedback on whether the loop configuration is satisfactory. If the designer is unhappy with the area or timing, the designer can return to process block 34 to further modify the loop configuration, as shown by arrow 38. On the other hand, if the designer is satisfied with the loop configuration, the RTL code can be generated and simulated (process blocks 40 and 42). Finally, an RTL synthesis tool can perform RTL synthesis (process block 44) and the gate level design can be verified and analyzed (process block 46).

Figure 3:
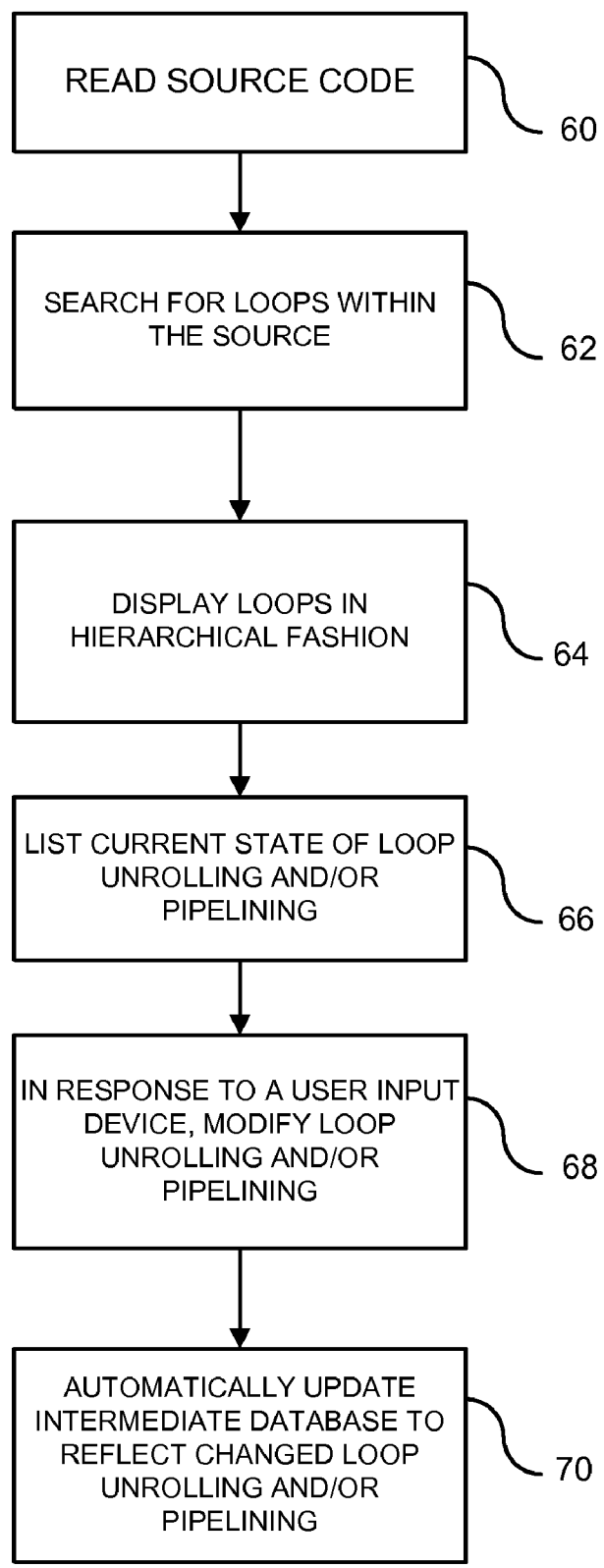
FIG. 3 is a flow chart of a method for allowing the user to interactively modify loop configurations.

FIG. 3 is a flowchart of a method for modifying loop configuration in the intermediate database. In process block 60, the behavioral synthesis tool reads in the source code file. In process block 62, the behavioral synthesis tool searches through the source code to find different loops identified in the source code. In process block 64, the loops are displayed in a hierarchical fashion so that the designer can immediately identify the interrelationship between loops and subloops. In process block 66, the default settings for the loop unrolling, pipelining and frequency are obtained from the source code and displayed as described further below. In process block 68, the designer can interactively modify the loop configuration by changing the loop unrolling or pipelining parameters. In process block 70, if the designer finally approves of the changes to the loop configuration, the intermediate database is automatically updated to reflect the changes made by the designer.

Figure 4:
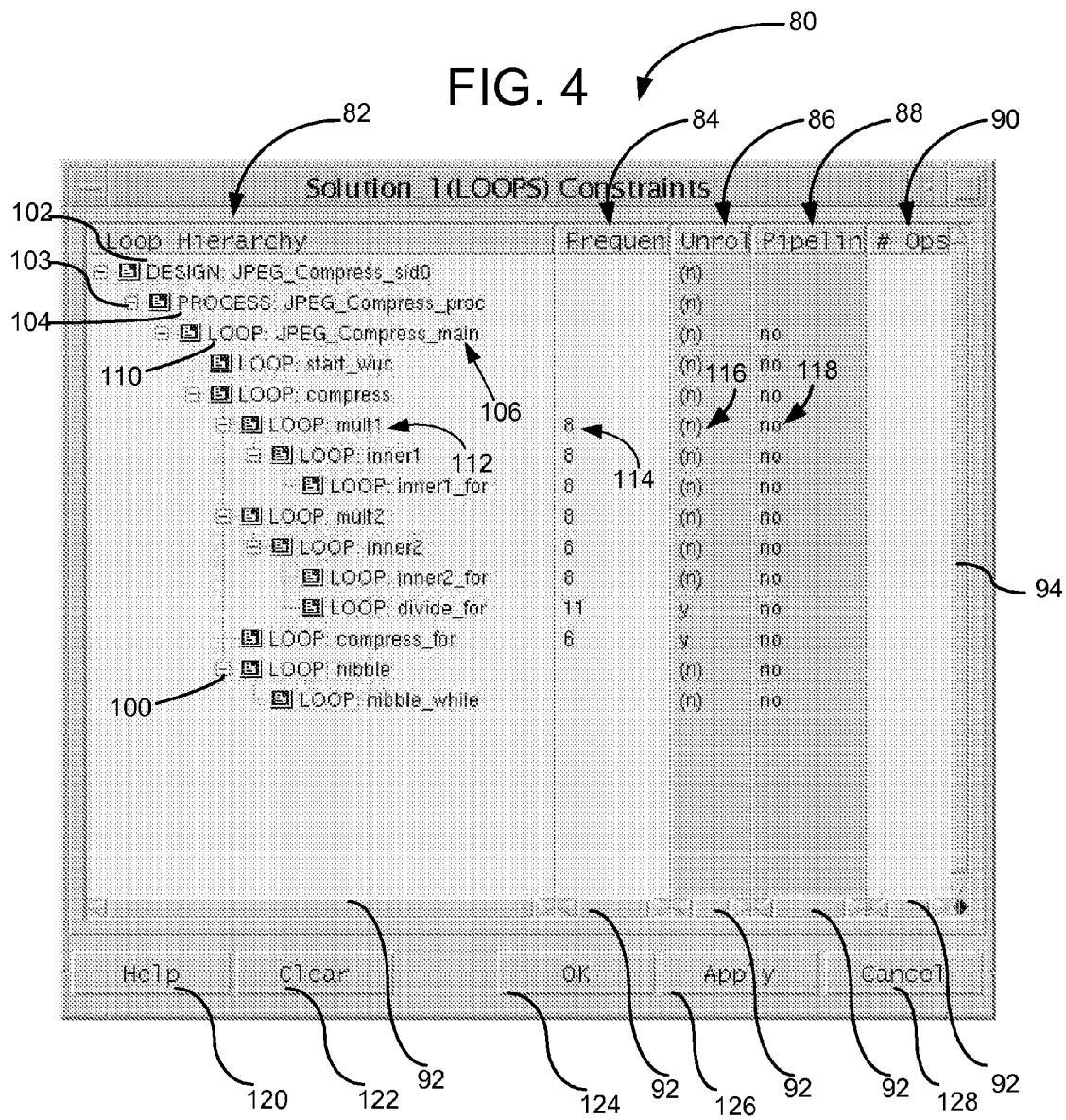
FIG. 4 is an example graphical user interface for allowing a user to interactively modify loop configurations.

FIG. 4 shows an example of the graphical user interface 80 (GUI) for allowing the designer to modify loop configurations interactively and dynamically. The user interface includes a loop hierarchy pane 82, a frequency pane 84, a loop unrolling pane 86, a pipelining pane 88, and an operations pane 90. Each of the panes has a respective horizontal scroll bar shown generally at 92. A vertical scroll bar 94 allows all of the panes to be scrolled simultaneously in a vertical direction. As is common in windowed applications, the scroll bars 92, 94 allow viewing of additional information associated with the panes.

The loop hierarchy pane 82 displays the loops identified from source code in a hierarchical fashion. Expand/collapse buttons, such as shown at 100, may be used to either display subloops under the loops or to keep the subloops hidden. The user interface 80 inserts a high-level description associated with the loop and also displays the loop name obtained from the source code. For example, at the top of the hierarchy is a description entitled "DESIGN", as shown at 102. This description as a design is obtained from the source code together with the design name, which is also displayed (i.e., JPEG_Compress_sid0). Because the expand/collapse button 103 is expanded, subloops under the DESIGN are also displayed. Under the "design" may be several processes, such as the process "JPEG_Compress proc", shown at 104. This process includes multiple loops and subloops generically identified with a label "LOOP" and the loop name. For example, at 106 shows the main loop entitled "JPEG_Compress_main", which is designated with a "LOOP" label shown at 110. The other loops and subloops are displayed in a similar fashion.

The remaining panes 84, 86, 88, and 90 have rows associated with the loops to provide further information about the loops. For example, the frequency pane 84 identifies the number of times a loop iterates. The loop iteration number is either obtained from the loop declaration in the source code (e.g., FOR i=1 to 8 . . . ) or the designer may manually insert the frequency so that the system can more accurately calculate the overall execution cycles. For example, loop "multi" shown at 112 is horizontally aligned with the number "8" in the frequency pane, as shown at 114. Some loops do not display a corresponding frequency because the loop declaration has an indefinite variable in the loop declaration. If the proper loop frequency is known, the designer may select the appropriate frequency (e.g., click on the frequency with a pointer) and modify the using a user-input device.

The unrolling pane 86 identifies the current state of the loop unrolling associated with each loop. The loop unrolling is initially set to defaults identified in the source code description, as shown in FIG. 4. For example, the loop "multi" is currently set to no loop unrolling as shown at 116. However, the designer may interactively and dynamically modify the loop unrolling via the GUI, as further described below. The unrolling may be either set to fully unrolled (denoted as "yes"), not unrolled (denoted as "no") or partially unrolled (denoted as an integer number specifying an unrolling factor).

The pipelining pane 88 identifies the current state of pipelining associated with each loop. The pipelining is initially set to defaults identified in the source code description. For example, the loop "multi" is currently set to no pipelining as shown at 118. However, the designer may interactively and dynamically modify the pipelining via the GUI, as further described below. Specifically, the pipelining may be set to different initiation intervals and also with or without rampup.

The "operations" pane provides a measure of complexity of the resulting circuit. It provides the designer with a number that indicates the size and speed of the hardware. If the number is too large, the designer may choose to alter the unrolling or pipelining configurations.

There are several user controls at the bottom of the GUI 80. For example, a "help" button 120 for providing a user with further operating instructions. A "clear" button 122 to clear the currently displayed loop configurations. An "OK" button 124 to save the current loop configurations displayed in the GUI to the SIF database and exit the window. An "Apply" button 126 to save the current loop configurations to the SIF database without exiting the window. And the "Cancel" button 128 to exit the window without updating the SIF database.

Figure 5:
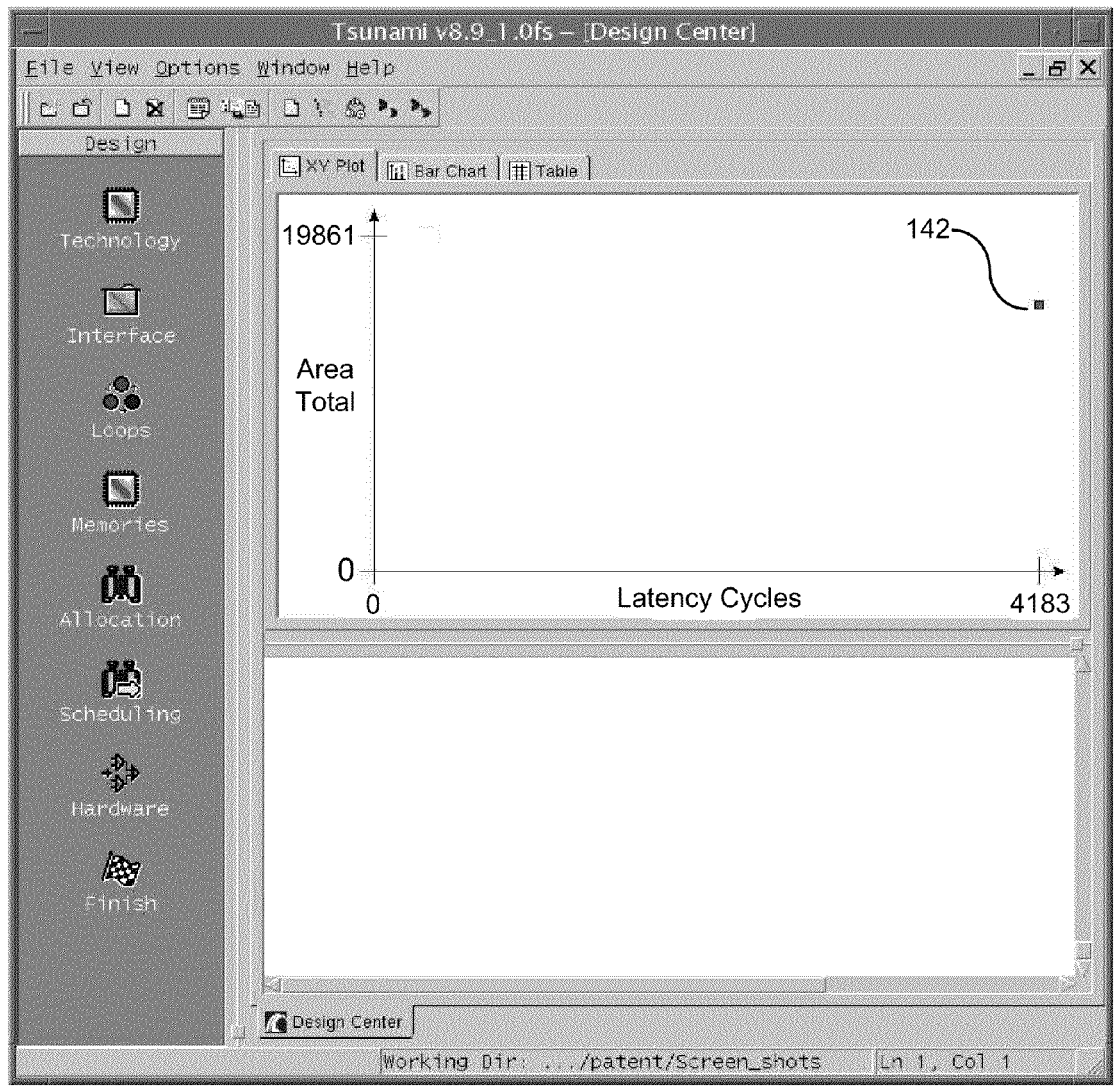
FIG. 5 is an example graphical user interface for displaying time verses area for the current design.

Once the loops are properly configured, the designer may request that timing analysis be performed. FIG. 5 shows an example of such an analysis. Window 140 shows an XY plot of area versus latency. Given the current loop configuration, the resultant area versus latency is shown at point 142. If unsatisfied with this result, the designer may return back to GUI 80 and modify the loop configuration without having to return to the source code, as shown in FIG. 6.

Figure 6:
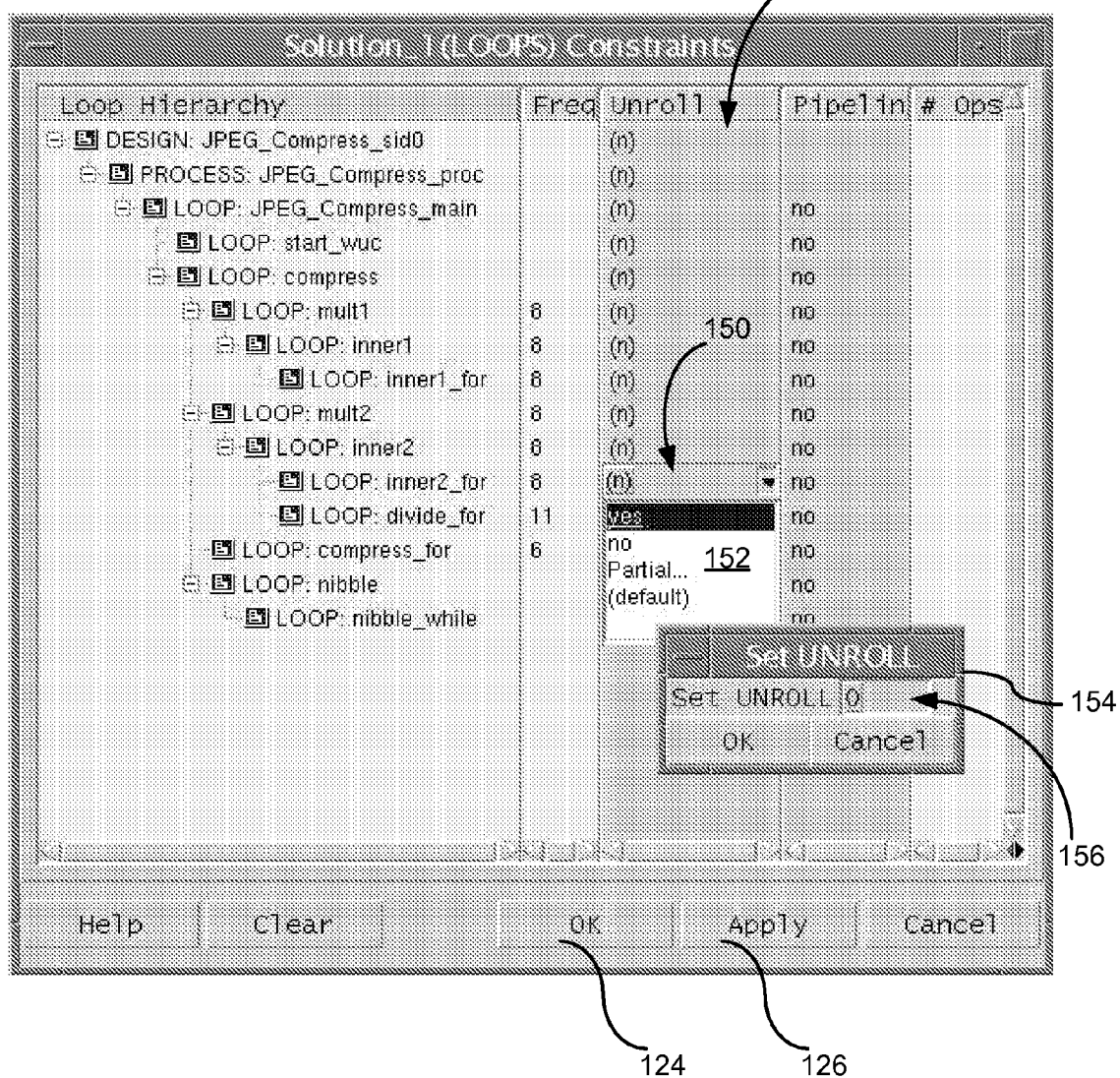
FIG. 6 is an illustration of a graphical user interface for modifying loop unrolling.

FIG. 6 shows the GUI 80 with the loop-unrolling pane being modified. Assuming a change is desired of the unrolling parameter for the loop "inner2_for", the designer selects the current setting as shown at 150, which causes drop down window 152 to be displayed. The window 152 has four selections in the illustrated embodiment. A selection of "yes" means the loop is fully unrolled. A selection of "no" means the loop is not unrolled. A selection of "default" means the default settings are used from the source code or inherited from the parent process in the hierarchy. Values inherited from the parent are denoted in parenthesis. Values from the source or supplied in the GUI do not have parenthesis. Finally, if "partial" is selected another window 154 is displayed that allows the user to insert a desired amount of unrolling into field 156. After the designer selects "OK" in the window 154, the window 80 is updated to reflect the changes. Thus, the designer may interactively change the loop unrolling without modification to the original source code.

Figure 7:
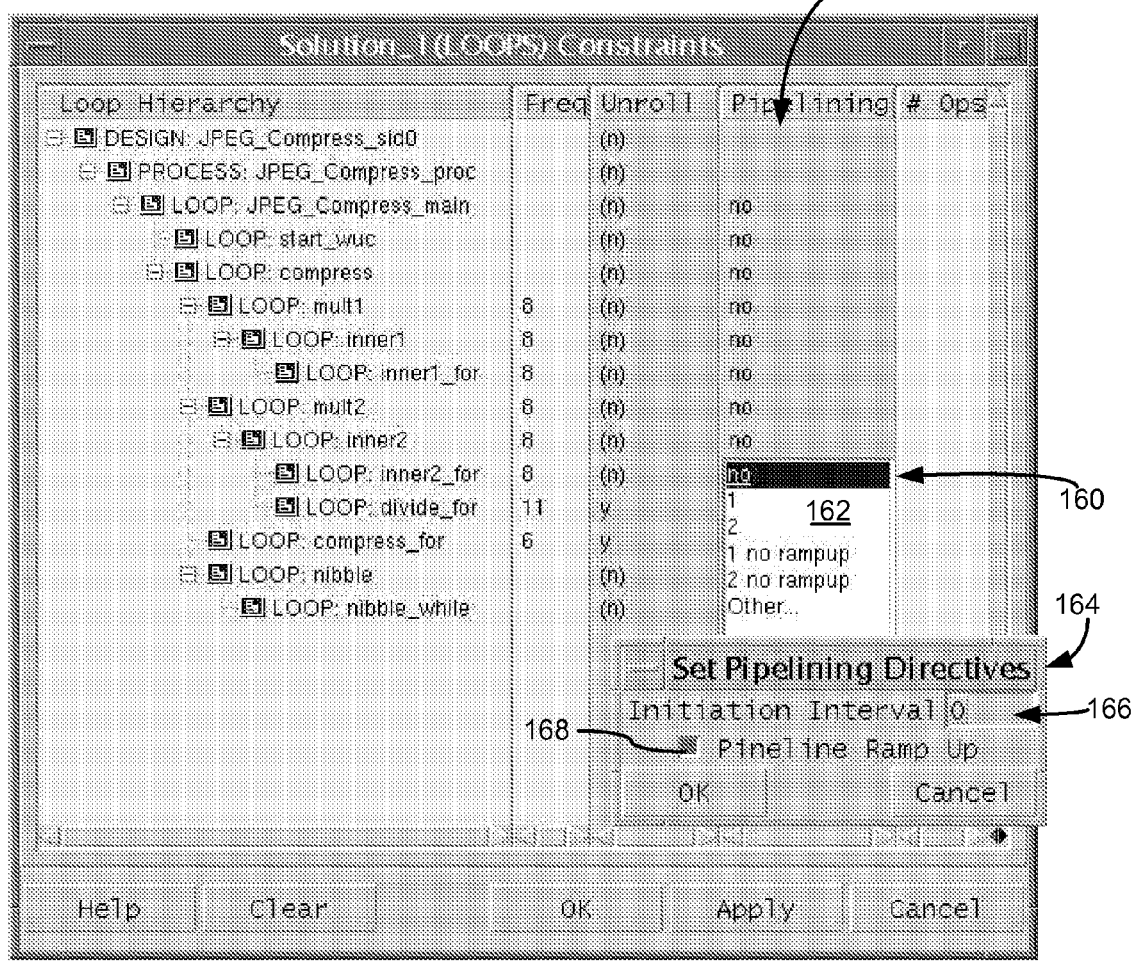
FIG. 7 is an illustration of a graphical user interface for modifying pipelining.

FIG. 7 shows the GUI 80 with the pipelining pane being interactively modified. Assuming a change is desired of the pipelining parameter for loop "inner2_for", the designer selects the current setting as shown at 160, which causes a drop down window 162 to be displayed. The window 162 of the illustrated embodiment has five options. A selection of "no" means no pipelining is desired for this loop. A selection of "1" means that the initiation interval is 1 (i.e., data is fed into the pipeline every clock cycle) and that rampup occurs after startup (i.e., the registers in the pipeline are initialized). A selection of "2" means that the initiation interval is 2 (i.e., data is fed into the pipeline every other clock cycle) and that rampup occurs. A selection of "1 with no rampup" means the initiation interval is 1, and the pipeline is not initialized. A selection of "2 with no rampup" means the initiation interval is 2, and the pipeline is not initialized. If the designer selects "other", the window 164 is displayed wherein the designer can enter any desired number into the initiation interval field 166. Additionally, the designer can select or unselect the "pipeline ramp up" check box 168. The designer can then select "OK" to close window 164.

Figure 8:
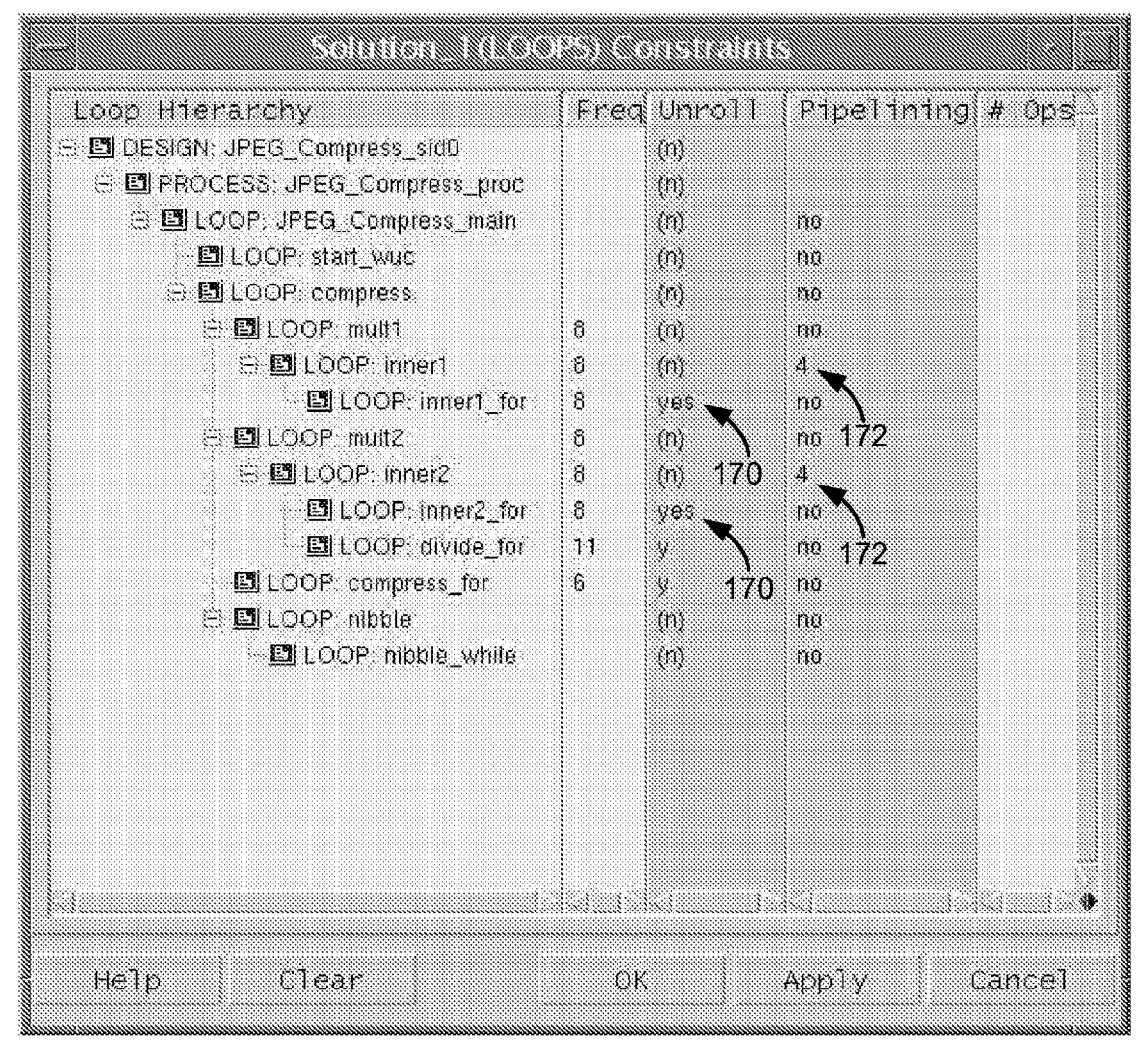

After the loop unrolling and/or pipelining are set to the desired values, the designer selects the "OK" button 124 or "Apply" button 126 to have the SIF updated. FIG. 8 shows an example where the loop unrolling and pipelining have been updated. Comparing FIG. 8 to FIG. 4, it is clear that the loop unrolling parameters 170 have been changed and the pipelining parameters 172 have been changed (to an initiation interval of 4). The designer can then apply these new parameters to the SIF and rerun synthesis.

Figure 9:
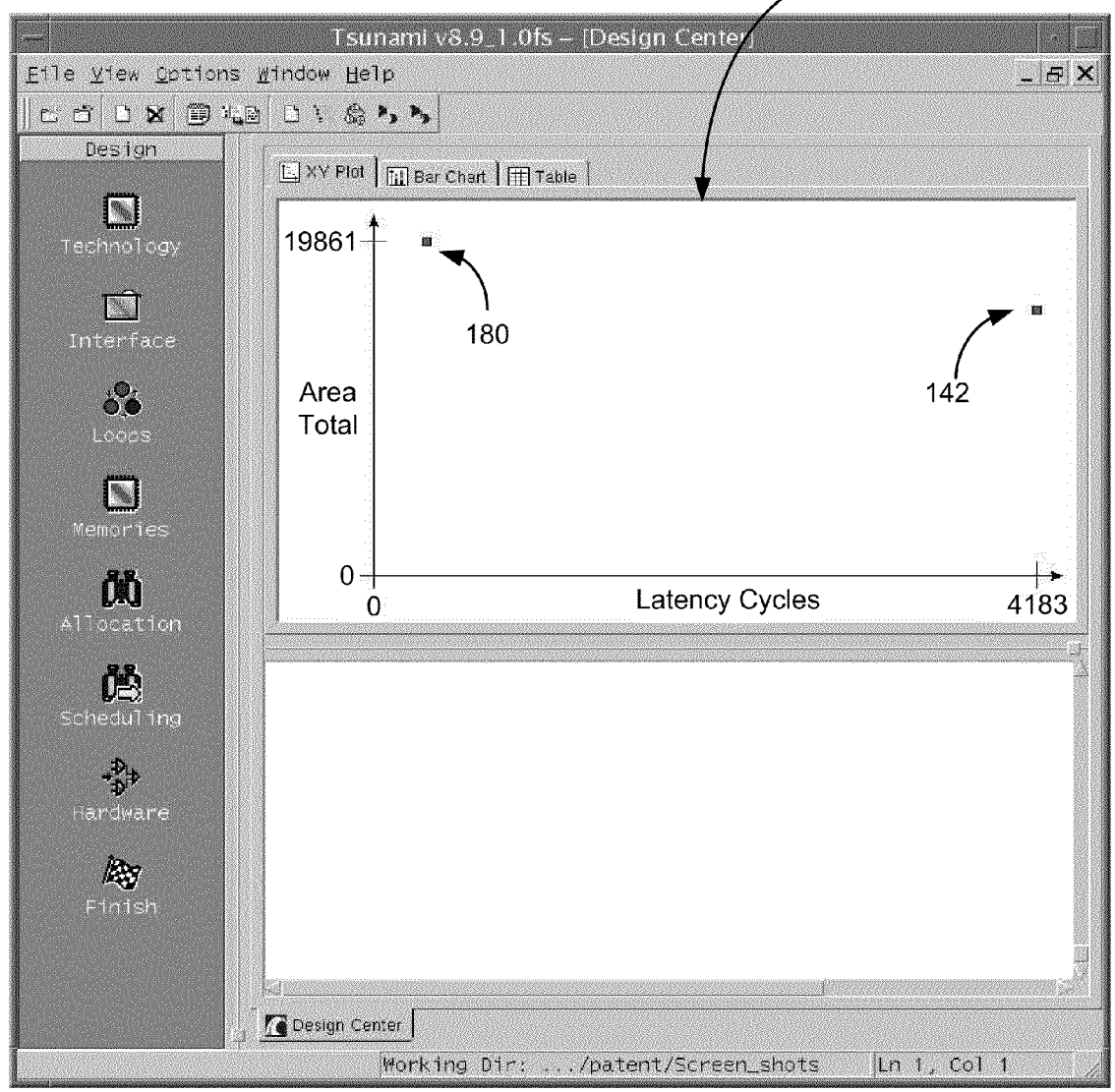
FIG. 9 is an illustration of a graphical user interface showing timing versus area for the design after manipulation of the loop configurations.

FIG. 9 shows an updated area versus latency plot 178 and a new point 180 is displayed for the modified SIF. The previous point 142 (from FIG. 5) is also displayed so that a simple comparison may be made. As can be seen, after the modifications, the number of cycles was reduced tremendously, with only a small sacrifice in area. Thus, the designer can modify loop characteristics, such as unrolling and pipelining dynamically without having to modify the original source code. Additionally, the designer can readily see the results of the changes and make a direct comparison to other designs.

Figure 10:
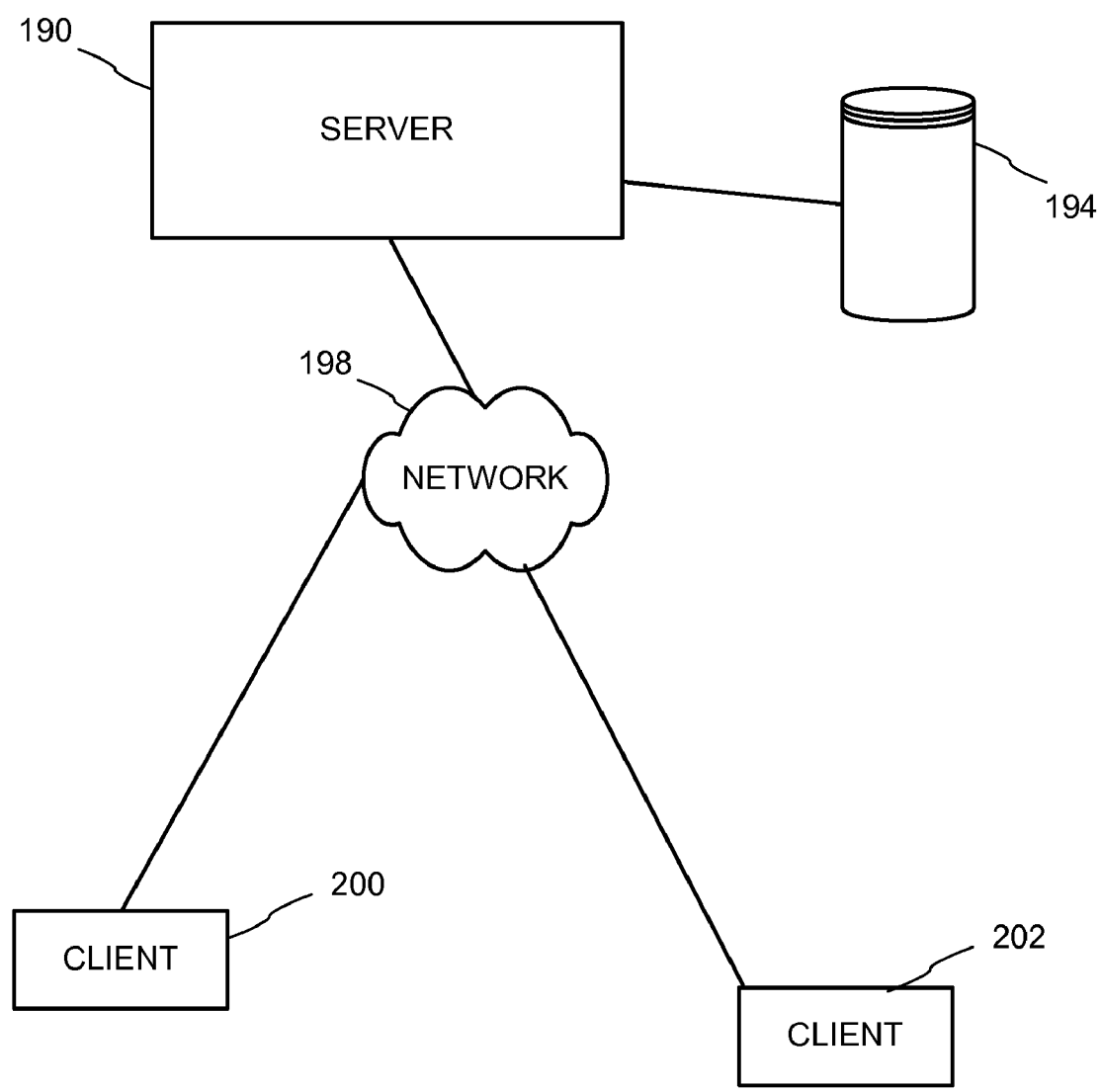
FIG. 10 shows a client/server system for modifying loop unrolling and pipelining configurations.

FIG. 10 shows that portions of the system may be applied to a distributed network. For example, a server computer 190 may have an associated database 194 (internal or external to the server computer). The server computer 190 may be coupled to a network shown generally at 198. One or more client computers, such as those shown at 200 and 202, may be coupled to the network to interface with the server computer using a network protocol.

Figure 11:
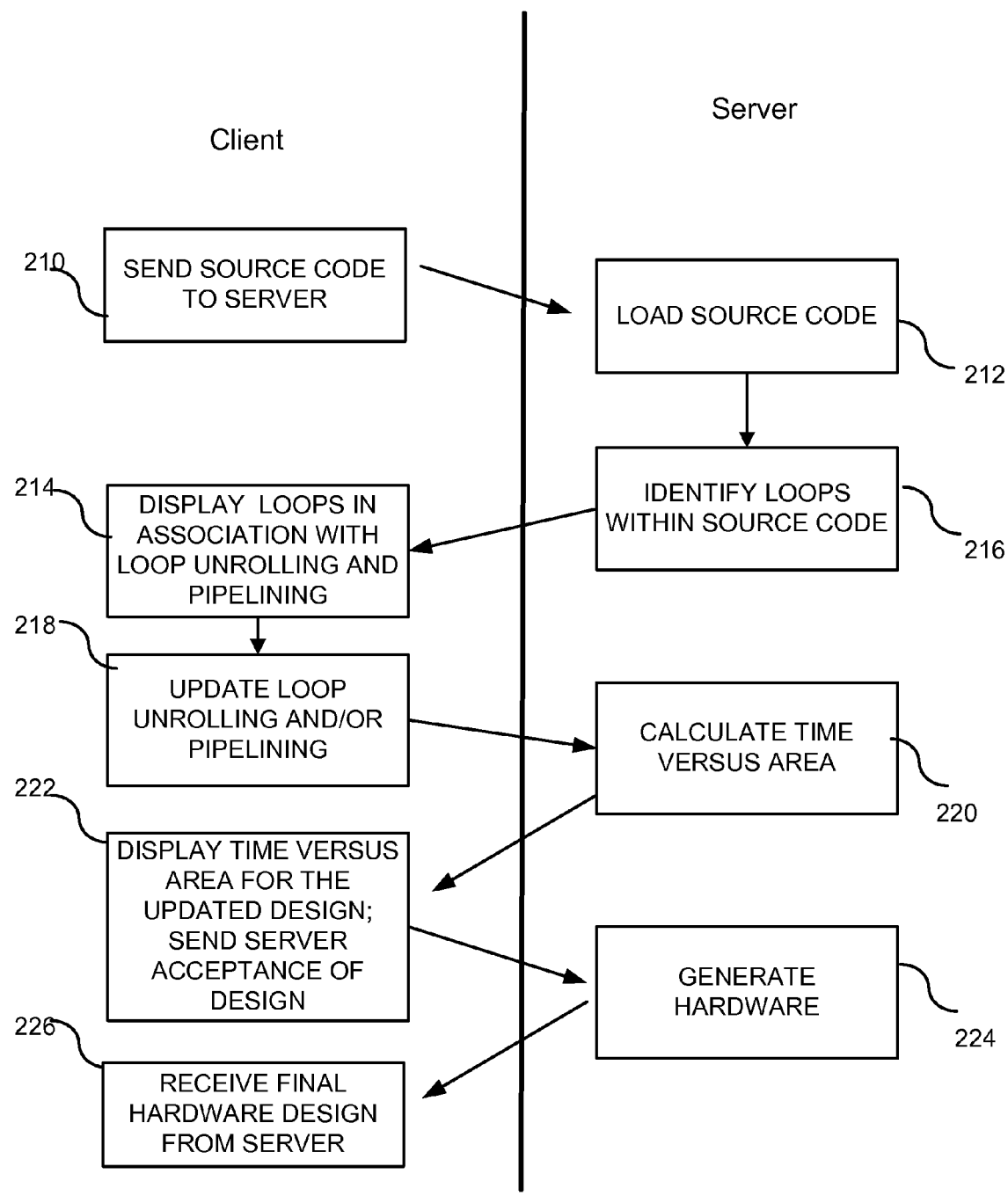
FIG. 11 shows a flowchart of a method for modifying the loop unrolling and pipelining configurations on the system of FIG. 10.

FIG. 11 shows that the loop manipulation may be accomplished in part by a remote server computer, such as server computer 190 in FIG. 10. In process block 210, the client computer sends source code to the server computer. In process block 212, the source code is loaded and loops are identified (process block 216). The server computer then passes to the client computer the loop information for display of the loops in a hierarchical format and current state of the loop unrolling and pipelining parameters. In process block 214, the client computer displays the loops in association with the loop unrolling and pipelining parameters. In process block 218, the designer updates the pipelining and loop unrolling parameters on the client computer and resends such modifications to the server computer. The server computer then calculates time versus area (process block 220) and sends such information to the client computer for display. In process block 222, the client computer displays time versus area for the designer. The designer may of course modify the loop configuration further so that process blocks 218 and 220 are repeated again. However, if the designer is satisfied with the design, the final loop unrolling and pipelining configuration information are sent to the server. The server then generates the hardware (process block 224) and sends the final design to the client (process block 226).

It should be noted that one or more of the foregoing process blocks may be carried out by the server instead of the client and vice versa. The particular division between the client and server is not of importance.

Figure 12:
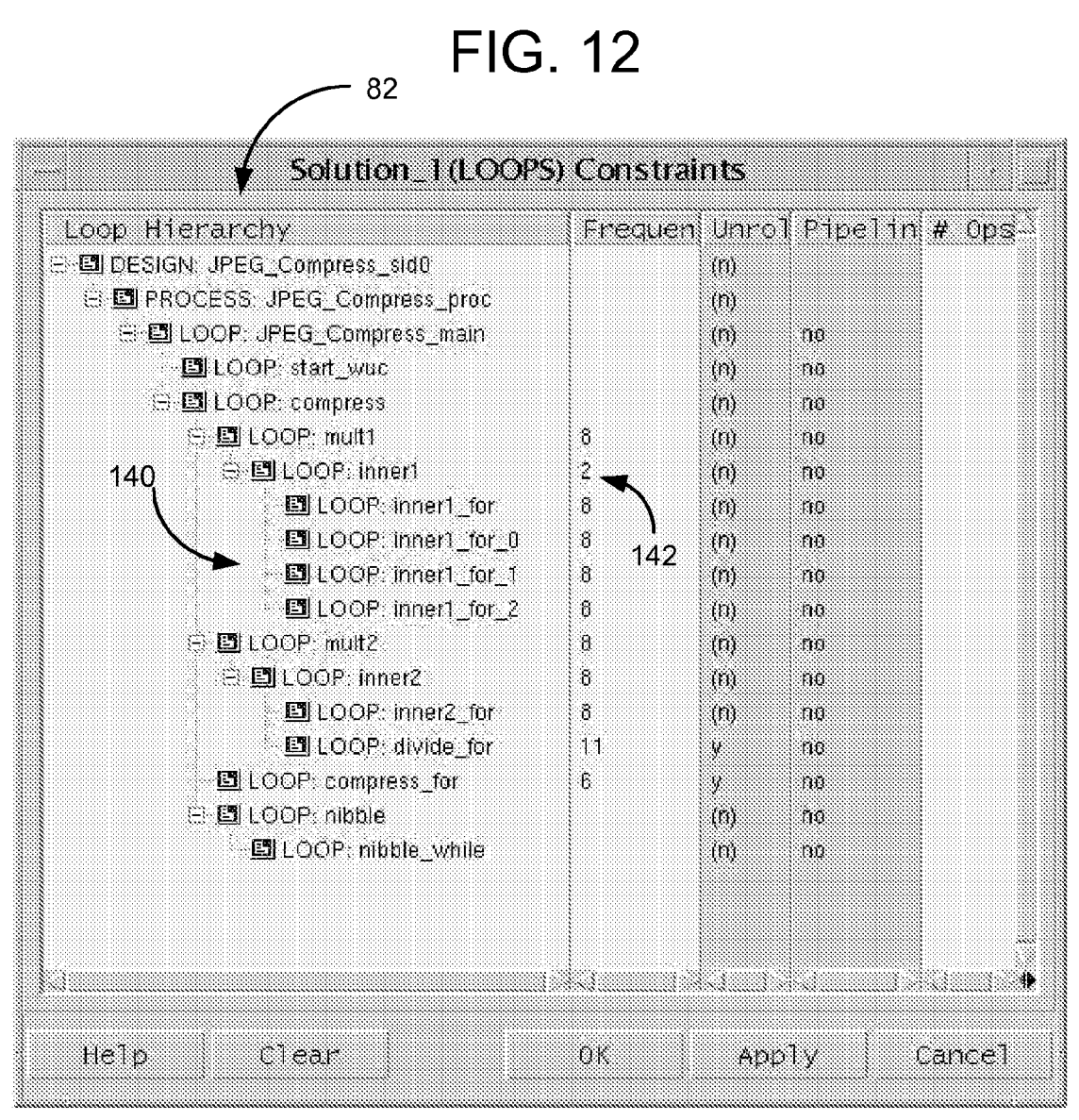

FIG. 12 shows the GUI 80 after one of the loops (i.e., "inner1") is unrolled. Turning briefly to FIG. 4, the loop "inner1" is has a frequency of "8" iterations and has a single subloop called "inner1_for". Returning to FIG. 12, after "inner1" is partially unrolled, the loop hierarchy panel 82 is updated to display four subloops shown at 140, each given a different title for differentiation. Thus, a different number is appended on the end of each loop name, such as inner1_for_0, inner1_for_1, etc. It should be noted that the synthesis tool generated these loop titles as these loops do not exist in the source code. As shown at 142, the loop frequency of loop "inner1" is reduced from 8 to 2 cycles, in order to reflect that the partially unrolled loop inner1 will now be iterated less times. Each of the new subloops shown at 140 may now be individually manipulated similar to the loop manipulation already described. For example, each loop may be individually unrolled or pipelined. Thus, this level of dynamic control allows loops to be unrolled and/or pipelined that cannot be configured using pragmas in source code, as that particular copy of the loop is not visible in the source code.

Having illustrated and described the principles of the illustrated embodiments, it will be apparent to those skilled in the art that the embodiments can be modified in arrangement and detail without departing from such principles.

For example, although a particular GUI was shown, the user interface can be modified to illustrate the pipelining and loop unrolling parameters in a different way. The particular user interface used is not important to the invention.

Additionally, the data structure stored in database 16 can be structured in a wide variety of ways. The particular data structure used is not important to the invention.

In view of the many possible embodiments to which the principles of our invention may be applied, it should be recognized that the illustrated embodiment is only a preferred example of the invention and should not be taken as a limitation on the scope of the invention. Rather, the scope of the invention is defined by the following claims. We therefore claim as our invention all that comes within the scope of these claims.

We claim:

1. A graphical user interface (GUI) for a behavioral synthesis tool, comprising:
    a loop hierarchy pane for displaying at least one loop identified within a source code file, the loop hierarchy pane being generated by searching the source code file for loops, identifying the at least one loop based on the search and displaying the at least one identified loop, wherein the source code file is a behavioral description of an integrated circuit; and
    a frequency pane for displaying a number representing how many times the at least one loop iterates.

2. The GUI of claim 1, further comprising an expand button for expanding the at least one loop to display a subloop within the at least one loop.

3. The GUI of claim 2, further comprising a collapse button for collapsing the at least one loop to hide the subloop.

4. The GUI of claim 1, further comprising a loop unrolling pane for identifying a loop unrolling state for the at least one loop.

5. The GUI of claim 4, wherein the loop unrolling pane may be modified to change the at least one loop.

6. The GUI of claim 1, further comprising a pipelining pane for identifying a pipelining state for the at least one loop.

7. The GUI of claim 6, wherein the pipelining pane may be modified to change the at least one loop.

8. The GUI of claim 1, further comprising an operations pane for providing a number that measures the complexity of a hardware design represented by the source code file.

9. The GUI of claim 1, further comprising a window showing an initial plot of area versus latency.

10. The GUI of claim 9, further comprising a window showing an updated plot of area versus latency to allow a designer to see results of changes to the at least one loop.

11. A graphical user interface (GUI) for a behavioral synthesis tool, comprising:
 means for displaying a loop hierarchy pane that includes at least one loop identified within a source code file, which is associated with an integrated circuit, the loop hierarchy pane being generated by searching the source code file for loops and displaying the at least one loop that is identified within the source code file; and
 means for displaying a frequency pane that includes a number representing how many times the at least one loop iterates.

12. The GUI of claim 11, further comprising an expand button for expanding the at least one loop to display a subloop within the at least one loop.

13. The GUI of claim 12, further comprising a collapse button for collapsing the at least one loop to hide the subloop.

14. The GUI of claim 11, further comprising a loop unrolling pane for identifying a loop unrolling state for the at least one loop.

15. The GUI of claim 14, wherein the loop unrolling pane may be modified to change the at least one loop.

16. The GUI of claim 11, further comprising a pipelining pane for identifying a pipelining state for the at least one loop.

17. The GUI of claim 16, wherein the pipelining pane may be modified to change the at least one loop.

18. The GUI of claim 11, further comprising an operations pane for providing a number that measures the complexity of a hardware design represented by the source code file.

19. The GUI of claim 11, further comprising a window showing an initial plot of area versus latency.

20. The GUI of claim 19, further comprising a window showing an updated plot of area versus latency to allow a designer to see results of changes to the at least one loop.

* * * * *